(12) United States Patent
Schiller et al.

(10) Patent No.: US 9,850,120 B2
(45) Date of Patent: Dec. 26, 2017

(54) MICROMECHANICAL COMPONENT HAVING A DIAPHRAGM

(71) Applicant: Robert Bosch GmbH, Stuttgart (DE)

(72) Inventors: Uwe Schiller, Tuebingen (DE);
Volkmar Senz, Metzingen (DE);
Jochen Franz, Reutlingen (DE);
Helmut Grutzeck, Kusterdingen (DE);
Michaela Mitschke, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 308 days.

(21) Appl. No.: 13/761,558

(22) Filed: Feb. 7, 2013

(65) Prior Publication Data

US 2013/0234140 A1    Sep. 12, 2013

(30) Foreign Application Priority Data

Feb. 10, 2012   (DE) .................. 10 2012 202 035

(51) Int. Cl.
| | | |
|---|---|---|
| *H01L 29/10* | (2006.01) | |
| *B81B 3/00* | (2006.01) | |
| *G01L 9/00* | (2006.01) | |
| *G01L 19/06* | (2006.01) | |
| *B81C 1/00* | (2006.01) | |
| *H04R 29/00* | (2006.01) | |

(52) U.S. Cl.
CPC ........ *B81B 3/0078* (2013.01); *B81C 1/00253* (2013.01); *G01L 9/0042* (2013.01); *G01L 19/0672* (2013.01); *B81C 2203/075* (2013.01); *H04R 29/00* (2013.01)

(58) Field of Classification Search
CPC .............................. H01L 22/32; H01L 22/34
USPC .............................................. 257/48; 438/18
See application file for complete search history.

(56) References Cited

U.S. PATENT DOCUMENTS

| | | | |
|---|---|---|---|
| 4,315,236 A | 2/1982 | Tominaga et al. | |
| 5,157,419 A | 10/1992 | Matsumoto et al. | |
| 5,366,454 A * | 11/1994 | Currie ................ | A61M 31/002 137/68.19 |
| 6,056,392 A | 5/2000 | Matsumoto et al. | |
| 6,192,749 B1 | 2/2001 | Marek et al. | |
| 6,359,458 B1 * | 3/2002 | Yoshii ................ | G01R 31/2829 324/762.01 |
| 7,564,338 B2 | 7/2009 | Muehlheim et al. | |
| 2002/0021970 A1 * | 2/2002 | Rohner ................ | F04B 43/009 417/63 |

(Continued)

FOREIGN PATENT DOCUMENTS

| | | |
|---|---|---|
| DE | 30 00 364 | 7/1980 |
| DE | 690 21 847 | 2/1996 |

(Continued)

*Primary Examiner* — Jami M Valentine
(74) *Attorney, Agent, or Firm* — Norton Rose Fulbright US LLP; Gerard Messina

(57) ABSTRACT

Measures are described with the aid of which not only a rupture, but also cracks may be detected in the diaphragm structure of a micromechanical component with the aid of circuit means integrated into the diaphragm structure. At least some circuit elements are integrated for this purpose into the bottom side of the diaphragm, i.e., into a diaphragm area directly adjoining the cavern below the diaphragm.

19 Claims, 4 Drawing Sheets

(56) References Cited

U.S. PATENT DOCUMENTS

| | | | | |
|---|---|---|---|---|
| 2004/0048113 | A1* | 3/2004 | Murphy | B01D 65/104 |
| | | | | 429/431 |
| 2004/0164423 | A1* | 8/2004 | Sherrer | G01L 9/0042 |
| | | | | 257/774 |
| 2006/0107752 | A1* | 5/2006 | Kotovsky | G01L 1/18 |
| | | | | 73/777 |
| 2006/0289415 | A1 | 12/2006 | Muehlheim et al. | |
| 2010/0206455 | A1* | 8/2010 | Uchiyama | H01M 8/04197 |
| | | | | 156/64 |
| 2011/0001500 | A1* | 1/2011 | Uchiyama | G01N 27/302 |
| | | | | 324/705 |
| 2012/0199496 | A1* | 8/2012 | Sekimoto | A61B 5/14532 |
| | | | | 205/775 |
| 2013/0255498 | A1* | 10/2013 | Shibata | B01D 61/02 |
| | | | | 96/10 |
| 2015/0260596 | A1* | 9/2015 | Lemke | G01L 9/0042 |
| | | | | 73/727 |
| 2017/0003239 | A1* | 1/2017 | Jeong | G01N 21/95 |

FOREIGN PATENT DOCUMENTS

| | | |
|---|---|---|
| DE | 197 35 666 | 2/1999 |
| DE | 10 2005 029 841 | 3/2006 |
| EP | 0 845 665 | 6/1998 |

\* cited by examiner

MICROMECHANICAL COMPONENT HAVING A DIAPHRAGM

CROSS REFERENCE

The present application claims the benefit under 35 U.S.C. §119 of German Patent Application No. DE 102012202035.7 filed on Feb. 10, 2012, which is expressly incorporated herein by reference in its entirety.

FIELD

The present invention relates to a micromechanical component having at least one diaphragm, which spans a cavern in the layer structure of the component, and having a circuit integrated into the diaphragm structure for electrically detecting cracks in the diaphragm structure.

BACKGROUND INFORMATION

In practice, there are multiple possible applications in various installation sites for micromechanical components of the type discussed herein. Cited here as examples are pressure sensor elements and microphone components in which the signal detection is based on a deflection of the diaphragm structure. There are, however, also fields of application in which the deformation behavior of the diaphragm is not important, e.g., in the case of a mass flow sensor. Here, the diaphragm structure is used as a thermally decoupled carrier for the measuring shunts.

During the manufacture and installation of the component as well as during the operation of the component at the particular installation site, overload situations may occur which lead to a rupture or at least cracks in the diaphragm structure. Ruptures extend across the entire thickness of a diaphragm and often occur in the edge or clamping area of the diaphragm, since the mechanical stress is greatest in this area. In contrast thereto, cracks form only on the surface of the diaphragm structure, but do not penetrate it entirely. These cracks usually grow from the bottom to the top, i.e., from the bottom side of the diaphragm facing the cavern to the top side of the diaphragm in the component surface. Even if cracks do not necessarily result in the severance of the diaphragm, i.e., rupture, they still cause a significant signal drift of the component.

German Patent Application No. DE 197 35 666 A1 describes a micromechanical mass flow sensor element whose measuring shunt is situated on a diaphragm in the component surface. In addition to the measuring shunt, other resistor elements, which are used for rupture detection, are situated on the component surface, namely in the clamping area of the diaphragm. For this purpose, the current flow through these resistor elements is continuously monitored, since a diaphragm rupture in the clamping area results in a sudden resistance increase.

SUMMARY

The present invention provides measures with the aid of which not only a rupture, but also cracks in the diaphragm structure may be detected.

This is achieved, according to an example embodiment of the present invention, in that at least some of the circuits for electrically detecting ruptures/cracks extend across a diaphragm area directly adjoining the cavern.

In accordance with the present invention, cracks, which lead to a significant impairment of the diaphragm function, may also be detected with the aid of the circuit at the point of the crack formation. The configuration of the circuit according to an example embodiment of the present invention on the bottom side of the diaphragm is based on the observation that such cracks frequently occur in the bottom side of the diaphragm facing the cavern and grow starting from there to the top side of the diaphragm. For this reason, the circuit for crack detection is integrated into a diaphragm area directly adjoining the cavern, i.e., to place them where the cracks develop.

There are different possibilities for implementing the concept according to the present invention, in particular when it comes to the type of the electrical circuit.

In one preferred specific embodiment of the present invention, the crack detection takes place by energizing the diaphragm, namely in particular a diaphragm layer directly adjoining the cavern, where the cracks mainly develop. Cracks which are oriented orthogonally to the direction of the current result in an interruption of the current flow and thus in an increase of the electrical resistance; this may be easily detected by monitoring the voltage at a constant supply current or by monitoring the current at a constant supply voltage.

The diaphragm is energized via connecting contacts on the component surface in the area of the diaphragm edge or the diaphragm frame. In this specific embodiment of the present invention, the component is also equipped with a monitor to monitor current flow through the diaphragm or the diaphragm layer adjoining the cavern.

In one advantageous refinement of this variant, at least one resistor element is implemented in the diaphragm layer directly adjoining the cavern. The resistor element extends across the entire length or width of the diaphragm. It is particularly advantageous if the resistor element generally extends across the entire diaphragm surface. In this case, the crack detection is based on a current feed to the resistor element on the bottom side of the diaphragm.

The cracks in the diaphragm structure discussed herein usually grow along the main crystal axes of the semiconductor material. In the case of silicon components, these crystal axes are generally oriented orthogonally to the current flow through an integrated resistor element. In one advantageous refinement of the present invention, this is utilized to perform a crack detection which is independent of process variations. In this variant, at least four connecting contacts are provided which are situated in the area of the diaphragm edge or the diaphragm frame and are interconnected in such a way that the diaphragm layer directly adjoining the cavern or the resistor element may optionally be energized in two different directions, i.e., in the case of a silicon component preferably orthogonally. The current may be conducted alternatingly in two orthogonal directions through the diaphragm bottom side. By comparing the electrical resistances measured in the process, the effect of the process-induced component variation in the crack detection may be considerably reduced.

When the crack detection—as described above—is based on a current flow through a diaphragm layer directly adjoining the cavern or a resistor element on the bottom side of the diaphragm, the current must initially be conducted to the bottom side of the diaphragm, which may be accomplished in various ways, depending on the semiconductor process option.

If the diaphragm is implemented in an epitaxial layer on a semiconductor substrate, the connecting contacts may be implemented in the epitaxial layer simply in the form of doped semiconductor areas, as are the resistor element(s) on the bottom side of the diaphragm. The doped semiconductor areas of the connecting contacts may extend across the entire thickness of the diaphragm and end in a doped resistance area, for example. It is, however, also possible that the doped semiconductor areas of the connecting contacts only extend up to a certain depth of the epitaxial layer.

In one embodiment variant of the present invention, the connecting contacts and, if necessary, the at least one resistor element have the same doping type as the epitaxial layer. However, the connecting contacts and the resistor elements must be doped significantly more strongly than the epitaxial layer to implement a sufficiently measurable current flow. Parasitic currents in the upper area of the diaphragm may be suppressed by one or also multiple insulation dopings in the diaphragm which must be appropriately situated between the connecting contacts for this purpose.

Alternatively, the connecting contacts and the resistor element may also have another doping type than that of the adjoining semiconductor material, so that they are electrically insulated against the adjoining semiconductor material via a reverse-biased p-n junction.

The concept according to the present invention of the crack detection may, however, also be implemented with the aid of at least one wired-in heat source and at least one temperature-dependent circuit element, since the heat flow is also impaired by cracks in the diaphragm structure. For this reason, in another specific embodiment of the present invention, a heat source and a temperature-dependent circuit element, which is used as a temperature sensor, is situated in the diaphragm layer directly adjoining the cavern. In this way, the heat flow within the diaphragm is monitored. The heat source and the temperature sensor are advantageously positioned in such a way that the heat flow is detected orthogonally to the potentially developing cracks. In this case, the heat flow reduction caused by a crack formation is most pronounced.

The heat source may be implemented in the form of a resistor, a diode, or a transistor. Resistors, diodes, or transistors may also be considered as temperature-sensitive circuit elements having a sensor function.

Another specific embodiment of the present invention utilizes the transistor principle to detect possible damage to the diaphragm structure. This variant is particularly suitable for monitoring very strongly miniaturized diaphragms which are implemented in an epitaxial layer on a semiconductor substrate. Here, the diaphragm is used as the basis of a transistor and is doped accordingly. The emitter area and the collector area of this transistor are implemented in the form of corresponding dopings in the area of the diaphragm edge. Moreover, the component is equipped with means for monitoring the collector-emitter current. Here, it is made use of the fact that the base current controls the collector-emitter current which is many times higher. As a result, every change of the base current, which is caused by crack formation in the diaphragm structure, has an effect on the collector-emitter current.

BRIEF DESCRIPTION OF THE DRAWINGS

As explained above, there are various possibilities for implementing and refining embodiments of the present invention in an advantageous manner. Below, is a description of multiple exemplary embodiments of the present invention on the basis of the figures.

DETAILED DESCRIPTION OF EXAMPLE EMBODIMENTS

Figure 1A:
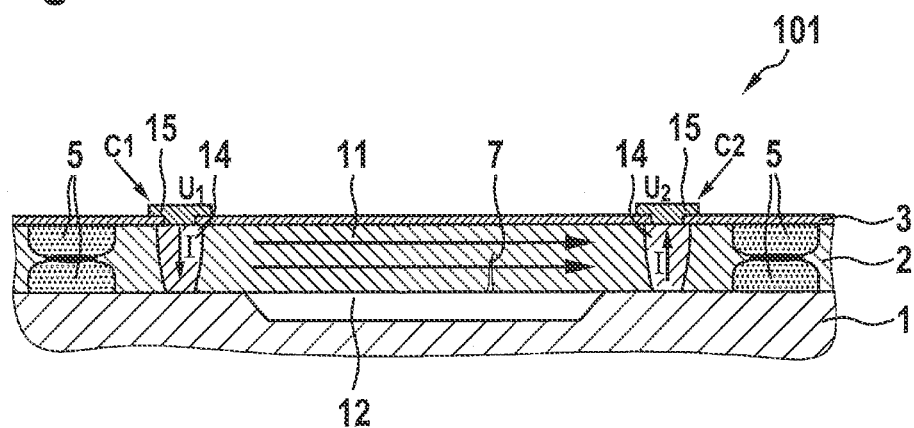
FIGS. 1a through 1d each show a section through the layer structure of a component according to an example embodiment of the present invention in which the crack detection is based on a current feed to the diaphragm or the bottom side of the diaphragm.

The micromechanical structure of component 101 illustrated in FIG. 1a is implemented in a layer structure which includes a semiconductor substrate 1, an epitaxial layer 2 on semiconductor substrate 1, and a passivating layer 3 on epitaxial layer 2 or on the component surface. One integral part of component 101 is a diaphragm 11 which is implemented in epitaxial layer 2 and spans a cavern 12 in substrate 1. Since cavern 12 has been produced here in a surface micromechanical process, it is closed off at the back side. Alternatively, the cavern could, however, also have a connecting opening to the substrate back side. Component 101 is equipped with circuit elements for electrically detecting cracks in diaphragm structure 11. At least some of these circuit elements extend according to the present invention across a layer area directly adjoining cavern 12.

Component 101 is equipped with connecting contacts 14/15 which are situated in the area of the diaphragm frame. The connecting contacts are implemented in the form of doped areas 14 which extend across the entire thickness of diaphragm 11 or epitaxial layer 2. These doped areas 14 are electrically contacted via metal contacts 15 on the component surface to energize diaphragm 11. Since the type of doping of contact areas 14 is the same as that of epitaxial layer 2, but contact areas 14 are doped significantly more strongly than epitaxial layer 2, the current density is generally homogeneous across the entire thickness of diaphragm 11, which is indicated by the arrows. A diaphragm rupture and also cracks in the diaphragm have an effect on the current density in diaphragm 11, which may be detected as a change in resistance.

The entire diaphragm area including connecting contacts 14 is girded by an insulation doping 5 in epitaxial layer 2 to electrically decouple the diaphragm area from other functional areas of component 101.

Figure 1B:
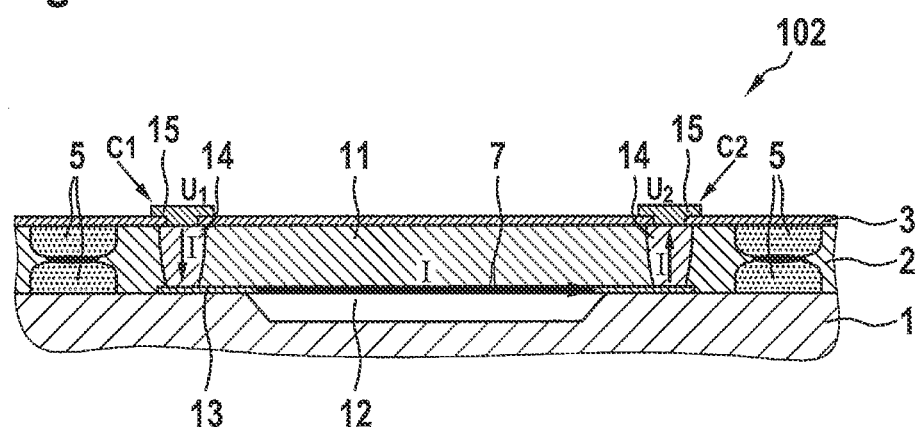

Component 102 illustrated in FIG. 1b has the same micromechanical structure as component 101. It is also equipped with connecting contacts 14/15 in the area of the diaphragm frame which extend across the entire thickness of the epitaxial layer. In addition, a resistor element 13 is implemented on the bottom side of diaphragm 11 of component 102, i.e., in a layer area directly adjoining cavern 12. Resistor element 13 is implemented here in the form of an electrically conductive layer having a p- or n-doping which extends across the entire length or width of diaphragm 11 and has a low square resistance. The doping was produced here within the scope of the semiconductor process by implantation or diffusion. The type of resistance doping 13 is the same as that of connecting contacts 14 which end in resistance doping 13. The adjoining semiconductor material has another doping type so that resistor element 13 and electrical connecting contacts 14 are electrically insulated against the adjoining semiconductor material by a p-n junction. In this way, the current is conducted between the two metal contacts 15 via connecting contacts 14 to the bottom side of diaphragm 11 and via resistor element 13, without noteworthy parasitic currents occurring above the resistor element.

In the case of component 102, the entire diaphragm area, here including resistor element 13 and connecting contacts 14, is also girded by an insulation doping 5 in epitaxial layer 2 to electrically decouple the diaphragm area from other functional areas of component 102.

Figure 1C:
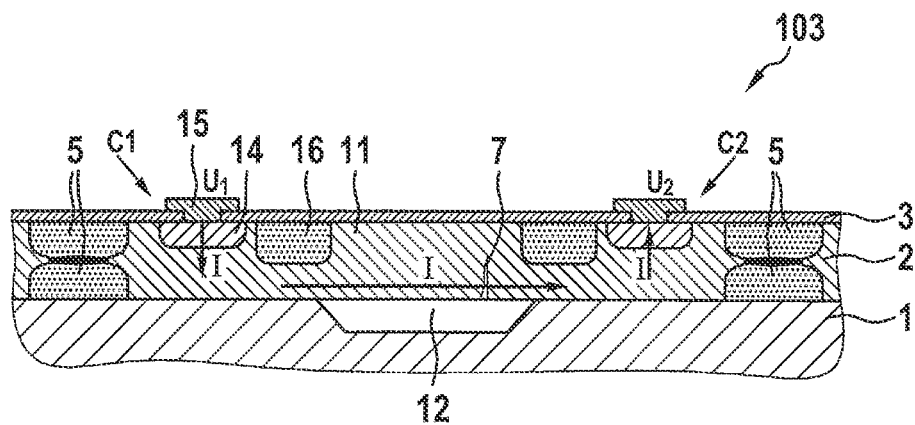

In contrast to the variant of a component 101 illustrated in FIG. 1a, doped areas 14 of the connecting contacts do not extend across the entire thickness of diaphragm 11 or epitaxial layer 2 in the case of component 103 illustrated in FIG. 1c, but only up to a certain depth of epitaxial layer 2. The type of doping of connecting contacts 14 is the same as that of epitaxial layer 2. However, connecting contacts 14 are doped significantly more strongly than epitaxial layer 2. Moreover, a circumferential insulation doping 16, which extends approximately as deeply into epitaxial layer 2 as the doping of connecting contacts 14, is implemented here in this area of the diaphragm edge. Insulation doping 16 ensures that the current flow between metal contacts 15 takes place via connecting contacts 14 and through a lower diaphragm layer directly adjoining cavern 12, in that insulation doping 16 prevents a parasitic current flow in the upper area of the diaphragm. It should be pointed out here that multiple such insulation dopings may also be implemented in the edge area of the diaphragm between the connecting contacts, or the diaphragm may also be provided with such an insulation doping across its entire surface.

Figure 1D:
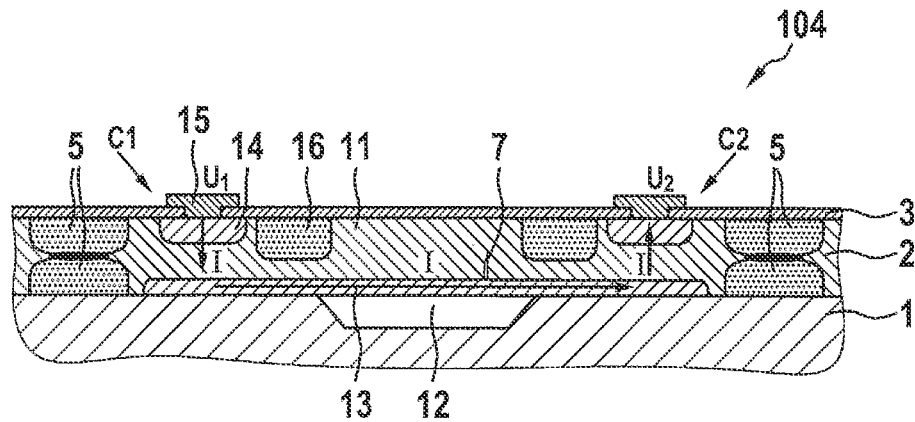

Component 104 illustrated in FIG. 1d differs from component 103 illustrated in FIG. 1c only in a resistance doping 13. This resistance doping 13 is implemented in a layer area of epitaxial layer 2 directly adjoining cavern 12 and has the same type of doping as that of connecting contacts 14 and that of epitaxial layer 2. However, resistance doping 13, just as the doping of connecting contacts 14, is considerably stronger than the doping of epitaxial layer 2, thus additionally facilitating the current flow through the diaphragm layer directly adjoining cavern 12, when a voltage is applied to metal contacts 15. Parasitic parallel currents within diaphragm 11 are also prevented here with the aid of an insulation doping 16 in epitaxial layer 2.

Since components 101 through 104 illustrated in FIGS. 1a through 1d do not differ otherwise either in design or in function, the same reference numerals were used in all figures.

In each of FIGS. 1a through 1d, a crack 7 is illustrated which starts from the bottom side of diaphragm 11 and extends into diaphragm 11. This results in an increase of the electrical resistance between connecting contacts 14, which may be easily detected by monitoring the current flow between connecting contacts 14. The wired-in element for monitoring the electrical resistance or the current flow are not illustrated here individually since FIGS. 1a through 1e only show the upper part of the component layer structure in the area of diaphragm 11.

Figure 1E:
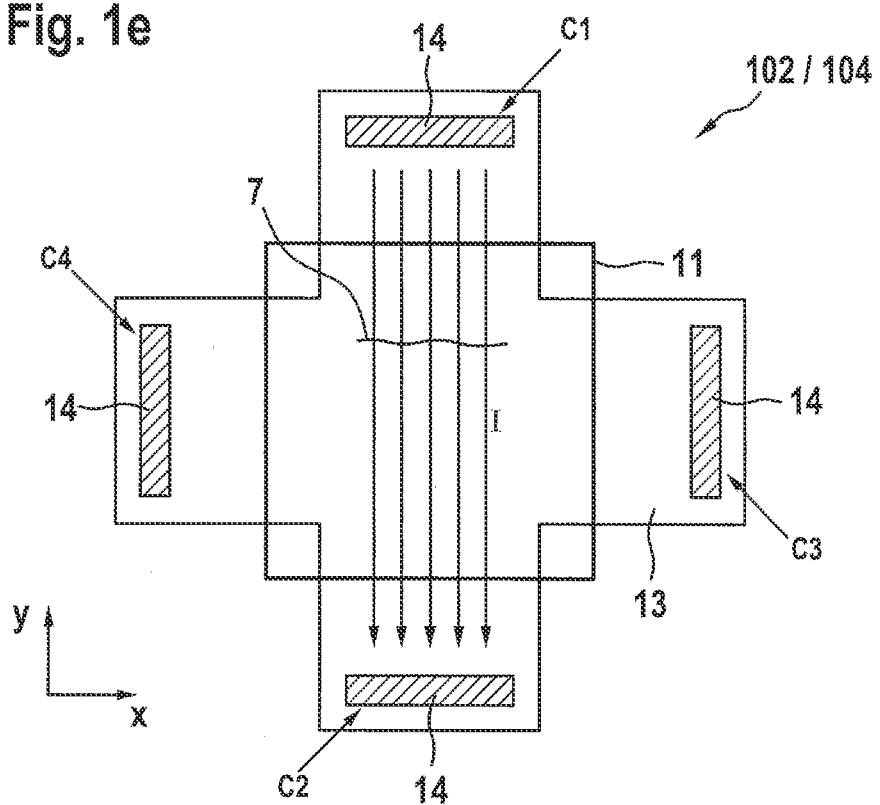
FIG. 1e shows a top view of the surface of a component according to the present invention having a resistor element for crack detection.

FIG. 1e shows a possible layout for resistor element 13 and illustrates a preferred variant of the signal detection for crack detection. Diaphragm surface 11 is a square in the illustrated exemplary embodiment. Matching thereto, electrically conductive layer 13 has a cross-shaped layout so that it completely covers the central area of diaphragm 11 and extends beyond the diaphragm surface on all four diaphragm sides. On every diaphragm side, one planar connecting contact 14 is situated for conductive layer 13. Only the four corners of diaphragm 11 are not covered by conductive layer 13. By reciprocally applying a voltage between each of two opposite connecting contacts 14, conductive layer 13 on the bottom side of diaphragm 11 may be alternatingly planarly energized in current directions, which are orthogonal to one another. In this case, cracks have a different effect on the resistance of electrically conductive layer 13 depending on their orientation to the current direction. This is illustrated by crack 7 shown here, which clearly impairs an orthogonal current flow between connections C1 and C2, while it has only a small effect, if at all, on the current flow between connections C3 and C4. By comparing the resistance values detected for the two current directions, cracks in the diaphragm structure may be detected independently of their orientation and independently of the process variations.

Figure 2:
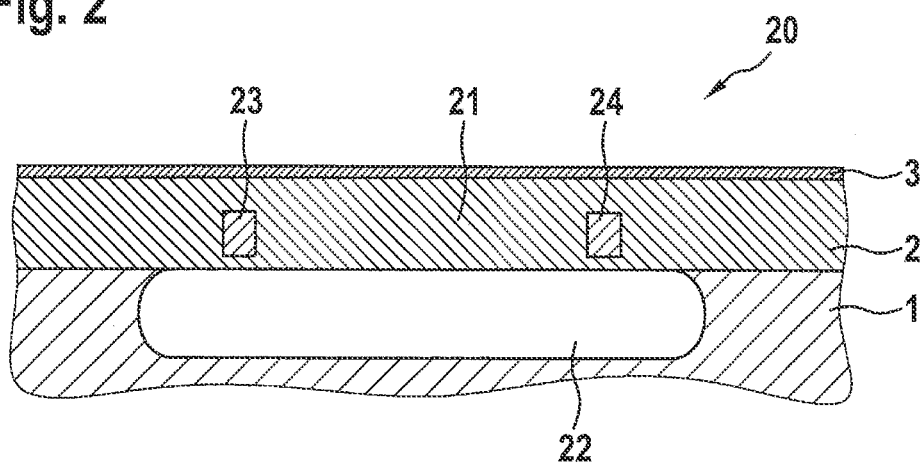
FIG. 2 shows a schematic sectional illustration through the layer structure of a component according to the present invention having means for monitoring the heat flow in the diaphragm structure.

Diaphragm 21 of component 20 illustrated in FIG. 2 is implemented in an epitaxial layer 2 above a semiconductor substrate 1 and spans a cavern 22 in substrate 1. On epitaxial layer 2 or the component surface, there is a passivating layer 3. In this case, a heat resistor 23 and a temperature-sensitive resistor 24 were integrated into the bottom side of diaphragm 21 as circuit elements for electrical detection of cracks in diaphragm structure 21. Since the two resistors 23 and 24 are situated on opposite sides of diaphragm 21, the heat flow caused by heat resistor 23 may be monitored within diaphragm 21 with the aid of temperature-sensitive resistor 24. Since the heat flow may be impaired by cracks in diaphragm structure 21, changes in the heat flow may be interpreted as indications for a crack formation within diaphragm structure 21.

Resistors 23 and 24 as well as suitable connecting contacts may be implemented in the form of doped areas within epitaxial layer 2 as in the case of components illustrated in FIGS. 1a and 1b.

Figure 3:
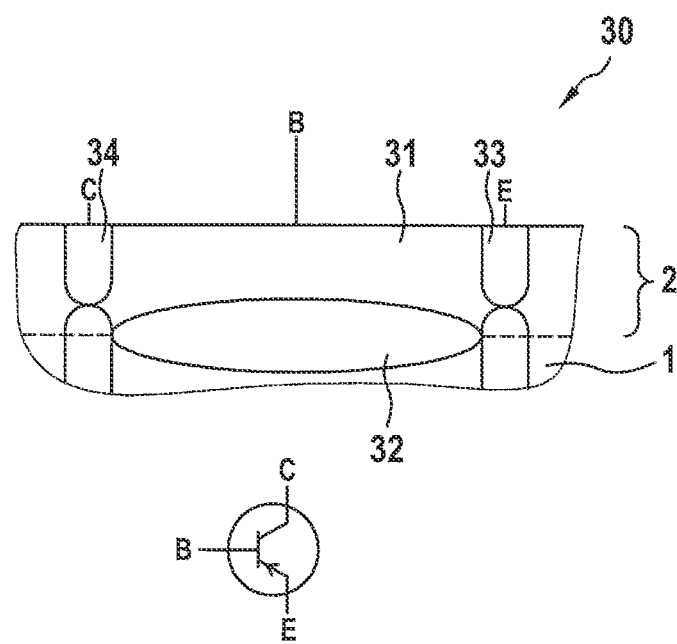
FIG. 3 shows a schematic top view through the layer structure of a component according to the present invention having a transistor for crack detection.

While in the case of components 101 and 102 the crack detection is based on monitoring the current flow on the bottom side of the diaphragm, and in the case of component 20 it is based on monitoring the heat flow on the bottom side of the diaphragm, the crack detection of component 30 illustrated in FIG. 3 is based on the transistor principle.

Diaphragm 31 of component 30 is implemented in an n-doped epitaxial layer 2 above a p-doped substrate 1 and spans a cavern 32 in substrate 1. Diaphragm 31 is used as the basis of a transistor whose emitter 33 and collector 34 are each implemented as a p-doped area in the frame area of diaphragm 31. Base connection B, collector connection C and emitter connection E of the transistor are only illustrated schematically in this case. In the transistor principle, the fact is utilized that cracks in diaphragm structure 31 have an effect on the base current. Such changes of the base current are transferred to the significantly larger collector-emitter current and may thus be reliably detected and evaluated.

What is claimed is:

1. A micromechanical component, comprising:
   at least one diaphragm which extends entirely across a cavern in the component, the component having a layered structure, wherein the diaphragm includes a top side and a bottom side, and wherein the cavern faces the bottom side; and
   a plurality of connecting contacts inside the diaphragm, the connecting contacts including at least one pair of connecting contacts separated by an area of the diaphragm extending across the cavern, such that a voltage applied to the pair of connecting contacts generates a current from a first one of the pair of connecting contacts, directly through the separating area, and into a second one of the pair of connecting contacts, wherein the current is indicative of a resistance of the diaphragm such that a change in the resistance caused by a crack extending from the bottom side towards the top side is reflected in the current;

wherein the component includes a layered structure having a semiconductor substrate, and an epitaxial layer on the semiconductor substrate, wherein the diaphragm is implemented in the epitaxial layer, wherein the connecting contacts are each implemented in the form of a doped semiconductor area which extend into the epitaxial layer, and wherein the doped area is electrically contacted via a metal contact on a component surface to energize the diaphragm, wherein the connecting contacts are between and girded by an insulation doping in the epitaxial layer to electrically decouple the diaphragm from other areas of the component, and wherein the connecting contacts have a same doping type as the epitaxial layer, the connecting contacts being doped more strongly than the epitaxial layer.

2. The component as recited in claim 1, further comprising:
a monitor to monitor a flow of the current through a layer of the diaphragm.

3. The component as recited in claim 1, wherein in the diaphragm layer directly adjoining the cavern, at least one resistor element is provided which extends at least across an entire length or width of the diaphragm and is contacted via the pair of connecting contacts.

4. The component as recited in claim 3, wherein the resistor element extends across an entire surface of the diaphragm.

5. The component as recited in claim 3, wherein the at least one pair of connecting contacts includes a first pair of connecting contacts and a second pair of connecting contacts, wherein each pair generates a current directly through the separating area via the resistor element, and wherein current flow between the first pair and current flow between the second pair are in two different directions.

6. The component as recited in claim 5, wherein the two directions are orthogonal.

7. The component as recited in claim 6, wherein the doped semiconductor areas extend across an entire thickness of the diaphragm.

8. The component as recited in claim 6, wherein the diaphragm is implemented in an epitaxial layer on a semiconductor substrate, and the connecting contacts are implemented in the form of doped semiconductor areas which extend into a depth at only a fraction of a thickness of the diaphragm starting from the component surface.

9. The component as recited in claim 7, wherein the at least one resistor element has a same doping type as the epitaxial layer, the resistor element being doped more strongly than the epitaxial layer.

10. The component as recited in claim 7, wherein current flow between the first pair of connecting contacts and the second pair of connecting contacts is conducted through a layer of the diaphragm directly adjoining the cavern, wherein the resistor element carries the current directly through the separating area without substantial parasitic currents occurring above the resistor element.

11. The component as recited in claim 7, wherein the connecting contacts have a different doping type than the epitaxial layer, so that the connecting contacts are electrically insulated by a p-n junction against adjoining semiconductor material.

12. The component as recited in claim 2, wherein, in the diaphragm layer directly adjoining the cavern, at least one wired-in heat source and at least one wired-in temperature sensor are situated, using which heat flow within the diaphragm is monitored.

13. The component as recited in claim 12, wherein one of a resistor, a diode, or a transistor is used as the heat source, and the temperature sensor is in the form of one of a resistor, a diode, or a transistor.

14. The component as recited in claim 1, wherein the diaphragm is implemented in an epitaxial layer on a semiconductor substrate, wherein the diaphragm is used and doped as a transistor, wherein an area of an edge of the diaphragm includes an emitter area and a collector area of the transistor, and wherein a monitor is provided to monitor collector-emitter current of the transistor.

15. The component as recited in claim 1, wherein current flow between the first pair of connecting contacts and the second pair of connecting contacts is conducted through a layer of the diaphragm directly adjoining the cavern, and wherein a parasitic current flow is substantially prevented in an upper area of the diaphragm by a circumferential insulation doping located between the first pair of connecting contacts and the second pair of connecting contacts.

16. The component as recited in claim 9, wherein current flow between the first pair of connecting contacts and the second pair of connecting contacts is conducted through a layer of the diaphragm directly adjoining the cavern, wherein the resistor element carries the current directly through the separating area without substantial parasitic currents occurring above the resistor element.

17. The component as recited in claim 8, wherein the connecting contacts have a same doping type as the epitaxial layer, the connecting contacts being doped significantly more strongly than the epitaxial layer.

18. The component as recited in claim 17, wherein the at least one resistor element has a same doping type as the epitaxial layer, the resistor element being doped significantly more strongly than the epitaxial layer.

19. The component as recited in claim 1, wherein the at least one pair of connecting contacts includes a first pair of connecting contacts and a second pair of connecting contacts, wherein the first pair of connecting contacts and the second pair of connecting contacts each generate current directly through respective separating areas of the diaphragm, and wherein current flow between the first pair of connecting contacts and current flow between the second pair of connecting contacts are in two different directions that are orthogonal.

* * * * *